(12) United States Patent
Yan et al.

(10) Patent No.: US 6,908,782 B2
(45) Date of Patent: Jun. 21, 2005

(54) HIGH CARRIER CONCENTRATION P-TYPE TRANSPARENT CONDUCTING OXIDE FILMS

(75) Inventors: Yanfa Yan, Littleton, CO (US); Shengbai Zhang, Lakewood, CO (US)

(73) Assignee: Midwest Research Instittue, Kansas City, MO (US)

( * ) Notice: Subject to any disclaimer, the term of this patent is extended or adjusted under 35 U.S.C. 154(b) by 96 days.

(21) Appl. No.: 10/344,446

(22) PCT Filed: Aug. 17, 2001

(86) PCT No.: PCT/US01/25874

§ 371 (c)(1),
(2), (4) Date: Feb. 11, 2003

(87) PCT Pub. No.: WO02/17359

PCT Pub. Date: Feb. 28, 2002

(65) Prior Publication Data

US 2004/0061114 A1 Apr. 1, 2004

Related U.S. Application Data

(60) Provisional application No. 60/226,188, filed on Aug. 18, 2000.

(51) Int. Cl.[7] ................. H01L 21/00; H01L 21/16; H01L 29/12
(52) U.S. Cl. ................. 438/85; 257/43; 257/79; 257/80; 428/432; 428/642; 438/86; 438/104; 438/754
(58) Field of Search ................. 257/43, 79, 80, 257/102; 438/85–86, 104, 754, 603, 608, 22, 30, 46; 428/432, 642

(56) References Cited

U.S. PATENT DOCUMENTS

| 4,612,411 A | 9/1986 | Wieting et al. |
|---|---|---|
| 5,078,803 A | 1/1992 | Pier et al. |
| 5,324,365 A | 6/1994 | Niwa |
| 5,420,043 A | 5/1995 | Niwa |
| 5,458,753 A | 10/1995 | Sato et al. |
| 5,578,501 A | 11/1996 | Niwa |
| 5,604,133 A | 2/1997 | Aoike |
| 5,612,229 A | 3/1997 | Yoshida |
| 5,620,924 A | 4/1997 | Takizawa et al. |
| 5,716,480 A | 2/1998 | Matsuyama et al. |
| 5,804,466 A | 9/1998 | Arao et al. |
| 5,913,986 A | 6/1999 | Matsuyama et al. |
| 5,990,416 A | 11/1999 | Windisch, Jr. et al. |
| 6,040,521 A | 3/2000 | Kushiya et al. |
| 6,043,427 A | 3/2000 | Nishimoto |
| 6,107,116 A | 8/2000 | Kariya et al. |
| 6,187,150 B1 | 2/2001 | Yoshimi et al. |
| 6,238,808 B1 | 5/2001 | Arao et al. |
| 6,242,687 B1 | 6/2001 | Schropp |

OTHER PUBLICATIONS

Joseph et al., "P–type electrical conduction in ZnO thin films by Ga and N codoping", Jpn. J. Appl. Phys. vol. 38 (1999), pp 1205–1207.*

PCT Publication WO00/22202, Yoshida, H. et al. p–Type ZnO Single Crystal and Method for Producing the Same, Apr. 20, 2000.

Y. Yan and S.B. Zhang, "Control of Doping by Impurity Chemical Potentials: Predictions for p–Type ZnO" American Phys. Society, vol. 86, No. 25, Jun. 18, 2001, pps. 5723–5726.

(Continued)

Primary Examiner—Donghee Kang
(74) Attorney, Agent, or Firm—Paul J. White

(57) ABSTRACT

A p-type transparent conducting oxide film is provided which is consisting essentially of, the transparent conducting oxide and a molecular doping source, the oxide and doping source grown under conditions sufficient to deliver the doping source intact onto the oxide.

8 Claims, 2 Drawing Sheets

OTHER PUBLICATIONS

K. Iwata et al., "Nitrogen–induced defects in ZnO: N grown on sapphire substrate by gas source MBE" Journal of Crystal Growth 209 (2000) Elsevier, pps. 526–531.

A.E. Delahoy et al., "Deposition Schemes for Low Cost Transparent Conductors for Photovoltaics," Mater. Res. Soc. Symp. Proc. vol. 426, 1996, pps. 467–477.

P. Yu et al., "Room Temperature Stimulated Emission from ZnO Quantum Dot Films," Proc. 23rd Intl. Conf. Physics of Semiconductors, Berlin, 1996, vol. 2, pp. 1453–1456.

G.F. Neumark, "Achievement of Well Conducting Wide––Band–Gap Semiconductors: Role of Solubility and Nonequilbrium Impurity Incorporations," Phys. Rev. Lett. 62, 1800 (1989).

T. Minami et al., "Highly Conductive and Transparent Silicon Doped Zinc Oxide Thin Films Prepared by RF Magnetron Sputtering," Jpn. J. Appl. Phys. 24, L781 (1985).

S.B. Zhang et al., "A phenomenological model for systematization and prediction of doping limits in II–VI and I–III–V12 compounds," J. Appl. Phys. 83, 3192 (1998).

D.J. Chadi, "Doping in ZnSe, ZnTe, MgSe, and MgTe Wide–Band–Bap Semiconductors," Phys. Rev. Lett. 72, 534 (1994).

S.B. Zhang et al., "Microscopic Origin of the Phenomenological Equilibrium 'Doping Limit Rule' in n–Type III–V Semiconductors," Phys. Rev. Lett. 84, 1232 (2000).

T. Minami et al., "Group III Impurity Doped Zinc Oxide Thin Films Prepared by RF Magnetron Sputtering," Jpn. J. Appl. Phys. 24, L781 (1985). ibid, 25, L776 (1986).

J. Hu et al., "Textured fluorine–doped ZnO films by atmospheric pressure chemical vapor deposition and their use in amorphous silicon solar cells," Solar Cells 30, 437 (1991).

R.M. Park et al., "p–type ZnSe by nitrogen atom beam doping during molecular beam epitaxial growth," Appl. Phys. Lett. 57, 2127 (1990).

A. Kobayashi et al., "Deep energy levels of defects in the wurtzite semiconductors A 1N, CdS, CdSe, ZnS, and ZnO," Phys. Rev. B 28, 946 (1983).

A.F. Kohan et al., "First–principles study of native point defects in ZnO," Phys. Rev. B 61, 15019 (2000).

S.B. Zhang et al., "Intrinsic n–type versus p–type doping asymmetry and the defect physics of ZnO," Phys. Rev. B 63, 75205 (2001).

M. Joseph et al., "p–Type Electrical Conduction in ZnO Thin Films by Ga and N Codoping," Jpn. J. Appl. Phys. 38, L1205 (1999).

H. Katayama–Yoshida et al., "New Materials of the Low––Resistive p–Type ZnO and Transparent Ferromagnet of ZnO: Prediction vs. Experiment," MRS Workshop on Transparent Conducting Oxides, Denver 2000.

K. Minegishi et al., "Growth of p–type Zinc Oxide Films by Chemical Vapor Deposition," Jpn. J. Appl. Phys. 36, L1453 (1997).

Xin–Li Guo et al., "Pulsed laser reactive deposition of p–type ZnO film enhanced by an electron cyclotron resonance source," J. Crystal Growth 223, 135 (2001).

Faughnan, B.W. and Crandall, R.S., entitled, "Electrochromic Displays Based on WO3" Topics in Applied Physics, 40: 181–211, 1980.

* cited by examiner

HIGH CARRIER CONCENTRATION P-TYPE TRANSPARENT CONDUCTING OXIDE FILMS

This application is a follow-up to provisional U.S. appl. Ser. No. 60/226,188 filed Aug. 18, 2000.

CONTRACTUAL ORIGIN OF THE INVENTION

The United States Government has rights in this invention pursuant to Contract No. DE-AC36-99GO10337 between the United States Department of Energy and the National Renewable Energy Laboratory, a division of the Midwest Research Institute.

TECHNICAL FIELD

The invention relates to p-Type transparent conducting oxide films and a method for making high quality p-Type transport conducting oxide films.

BACKGROUND ART

Zinc oxide (ZnO), like other transparent conducting oxides, is an important material for-next generation short-wavelength optoelectronic devices such as low cost, optically transparent light-emitting diodes (LEDs) and laser diodes, transparent p–n junctions, large area flat-panel displays, and solar cells. J. Hu and R. Gordon, Solar cells, 30, 437 (1991); A. E. Delahoy and M. Cherny, Mater. Res. Soc. Symp.Proc. 426, 467 (1996); and P. Yu, Z. K. Tang, G. K. L. Wong, M. Kawasaki, A. Ohtomo, H. Koinuma, and Y. Segawa, Proc. 23th Int. Conf. Physics of Semiconductors, Berlin, 1996, vol. 2, p. 1453.

To obtain these device applications, it is important to provide the technology necessary for fabrication of both high quality p-type and n-type ZnO films. However, like most wide-band-gap semiconductors, ZnO has the asymmetric doping limitations, G. F. Neumark, Phys. Rev. Lett. 62, 1800 (1989), T. Minami, H. Sato, H. 25 Nanto, and S. Tanaka, Jpn. J. Appl. Phys. 24, L781 (1985), S. B. Zhang, S. -H. Wei, and A. Zunger, J. Appl. Phys. 83, 3192 (1998), D. J. Chadi, Phys. Rev. Lett. 72, 534 (1994); S. B. Zhang, S. -H. Wei, and A. Zunger, Phys. Rev. Lett. 84, 1232 (2000), i.e., it can be easily doped high quality n-type, T. Minami, H. Sato, H. Nanto, and S. Tanaka, Jpn. J. Appl. Phys. 24, L781 (1985), ibid. 25, L776 (1986), J. Hu and R. G. Gordon, Solar Cells 30, 437 (1991), but difficult to dope p-type.

Accordingly, fabricating high quality p-type films is the existing challenge in order to obtain the device application of ZnO. Nitrogen, a good p-type dopant for other II–VI semiconductors, R. M. Park, M. B. Troffer, C. M. Rouleau, J. M. DePuydt, and M. A. Haase, Appl. Phys. Lett. 57, 2127 (1990), has long been considered as a possible dopant for p-type ZnO. A. Kobayashi, O. F. Sankey, and J. D. Dow, Phys. Rev. B 28, 946 (1983). Recent theoretical studies have revealed that the difficulty of making p-type ZnO results from the compensation of low formation energy donor like defects, mainly O vacancies (Vo). A. F. Kohan, G. Ceder, D. Morgan and C. G. van de Walle, Phys. Rev. B 61, 15019 (2000), S. B. Zhang, S. -H. Wei, and A. Zunger, Phys. Rev. B 63, 75205 (2001), Y. Yan, S, J. Pennycook, and S. T. Pantelides, (to be published).

Yamamoto and Katayama-Yoshida proposed that high carrier concentration p-type ZnO films can be achieved by Ga and N codoping approach, T. Yamamoto and H. Katayama-Yoshida, Jpn. J. Appl. Phys. 38, L 1 66 (1999), based on their theoretical findings, i.e., the formation of acceptor-donor-acceptor complexes ($N_o$—$Ga_{zn}$—$No$) to significantly reduce the Madelung energy of the system. By applying this approach, Joseph et al. reported that high carrier concentration ($4\times10^{19}$ cm$^{-3}$), but very low mobility (0.07 cm$^2$/V.s) p-type ZnO films have been observed using $N_2O$ gas with electron cyclotron resonance (ECR) plasma and an additional Ga source. M. Joseph, H. Tabata, and T. Kawai, Jpn. J. Appl. Phys. 38, L1205 (1999). However, the codoping approach can only be realized successfully at a very narrow growth window, e.g., low substrate temperature and restrictedly controlled vapor pressure. H. Katayama-Yoshida, MRS Workshop on Transparent Conducting Oxides, (Denver, 2000). These stringent restrictions are due to the complexity of utilizing specific metastable configuration of $N_o$—$G_{zn}$—$N_o$, multidopant sources and plasma. Thus, the application of the codoping approach is limited, and new methods for fabricating high carrier concentration p-type ZnO films are needed.

We are aware of only three reports on p-type ZnO films. However, they used different dopants. In one report, ammonia was used as a dopant (K. Minegishi, Y.Koiwai, Y. Kikuchi, K. Yano, M. Kasuga, and A. Shimizu, Jpn, J. Appl. Phys. 36, L1453 (1997)). In the other two reports, $N_2O$ gas was used as a dopant (M. Joseph, J. Tabata, and T. Kawai, Jpn. J. Appl. Phys. 38, L1205 (1999); X. L. Guo, H. Tabata, and T. Kawai, J. Crystal Growth 223, 135 (2001)). Some advantages of our invention have been addressed in our provisional application.

U.S. Pat. Nos. 5,578,501; 5,420,043; and 5,324,365 each disclose methods for manufacturing solar cells in which a ZnO transparent conducting layer is used as electrodes. The ZnO layer used in these three patents are not made to be p-type conductors.

A method for continuously depositing transparent oxide material (including ZnO) by chemical pyrolysis is disclosed in U.S. Pat. No. 5,180,686. This patent only disclose a method for making regular ZnO films for solar cell use, in which the ZnO is an n-type conductor.

U.S. Pat. No. 5,612,229 discloses a method for manufacturing solar cells in which a ZnO transparent conductor layer is used as electrodes. This patent does not disclose how to make p-type ZnO and other metal oxide films.

U.S. Pat. Nos. 5,804,466 and 6,238,808 B1 disclose methods of producing high quality ZnO films for use in solar cells. These patents do not disclose any method for making p-type ZnO films.

Methods for manufacturing solar cells is disclosed in U.S. Pat. Nos. 5,716,480 and 5,913,986; however, these patents do not disclose methods for making p-type ZnO films. U.S. Pat. No. 5,458,753 disclose better quality ZnO films containing Ga. The ZnO films are n-type materials.

A method of producing n-type ZnO film used as window layers in solar cells is disclosed in U.S. Pat. No. 6,040,521.

U.S. Pat. No. 5,990,416 discloses a method to reduce a dopant in metal oxide films. The dopant is a metal element. This patent does not disclose any method for making p-type ZnO films.

U.S. Pat. No. 5,078,803 discloses a method for manufacturing solar cells incorporating transparent electrodes comprising hazy ZnO. This patent does not disclose any method for making p-type ZnO films.

A method for manufacturing a thin film photovoltaic device comprising a transparent conductive film, which may be ZnO is disclosed in U.S. Pat. No. 6,187,150 B1. This patent does not disclose any method for making p-type ZnO films.

U.S. Pat. No. 5,620,924 discloses a method of preventing deterioration of film quality of transparent conductive film, which may be ZnO. This patent does not disclose any method for making p-type ZnO films.

A process for producing a thin film solar cell is disclosed in U.S. Pat. No. 6,242,687 B1. This patent does not disclose any method for making p-type ZnO films.

U.S. Pat. No. 6,107,116 discloses a method for producing a photovoltaic element with ZnO as a layer having increasing F content in the layer thickness direction. This patent does not disclose a method for making p-type ZnO films.

A method for manufacturing photovoltaic devices is disclosed in U.S. Pat. No. 6,043,427. The method does not disclose making p-type ZnO films.

A method for manufacturing photovoltaic devices comprising ZnO films is disclosed in U.S. Pat. No. 5,604,133. This patent does not disclose making p-type ZnO films.

U.S. Pat. No. 4,612,411 discloses a method for producing thin film solar cells with ZnO window layers. This patent does not disclose methods for making p-type ZnO films.

DISCLOSURE OF INVENTION

One object of the present invention is to provide a method for fabricating high quality p-type transparent conducting films, including ZnO films using either NO or $NO_2$ gas as a dopant and under Zn-rich growth conditions.

Another object of the present invention to provide high quality p-type films of transparent conducting oxides, such as ZnO, CdO, $In_2O_3$, $SnO_2$, $Ga_2O_3$ and the alloys thereof.

A further object of the present invention is to use the films objects in the formation of shallow acceptor defects via multi-site substitution of NO or $NO_2$ molecules, i.e., one molecule occupies more than one normally O sites, (which is highly energetically preferred) to provide high hole concentrations.

A still further object of the present invention is to use a NO or $NO_2$ gas to further suppress the formation of donor-like defects such as Vo and $Zn_i$, to provide high hole mobility.

In general, the problems of the prior art methods are surmounted by providing a p-type transparent conducting oxide consisting essentially of a transparent conducting oxide and a molecular doping source, the oxide and doping source being grown under conditions sufficient to deliver the doping source intact onto the oxide before it dissociates.

BEST MODE FOR CARRYING OUT THE INVENTION

Figure 1:
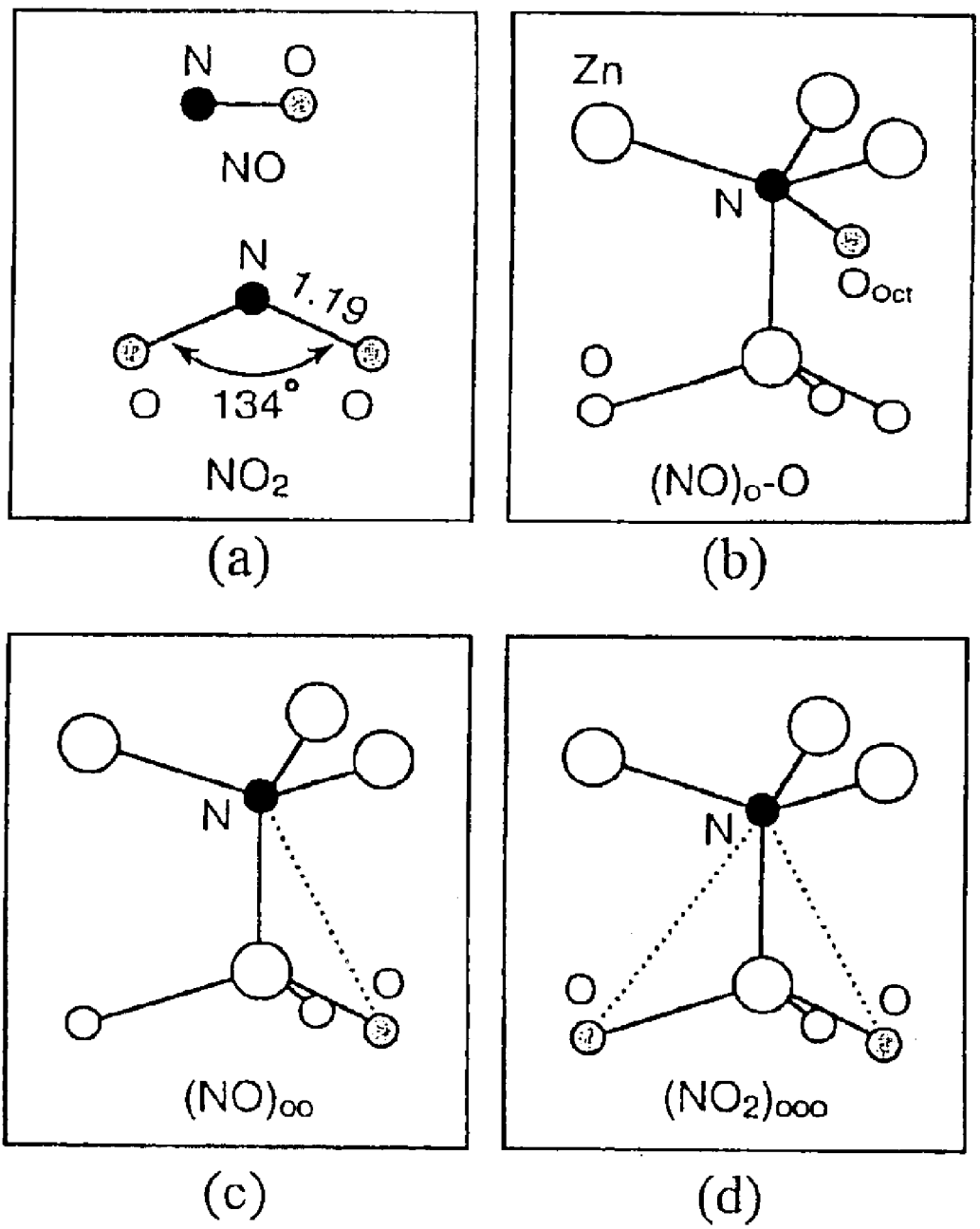
FIG. 1(a) shows the structure of the NO and $NO_2$ molecule.
FIG. 1(b) shows the single —O— site substitutional NO, denoted as $(NO)O$—O, which is formed by a NO molecule substituting an O atom.
FIG. 1(c) shows the double —O— site substitutional $NO:(NO)_{oo}$.
FIG. 1(d) shows the triple —O— site substitutional $NO_2$, $(NO_2)_{OOO}$.

Following hereafter is an illustration of the utility of solutions for fabricating the high quality p-type ZnO films, according to the present invention. High quality p-type ZnO films through first-principles total energy calculations are: High quality p-type ZnO films achieved using either NO or $NO_2$ gas as a dopant under Zn-rich growth conditions. The formation of shallow acceptor defects via multi-site substitution of NO or $NO_2$ molecules, i.e., one molecule occupies more than one normally O sites, is energetically highly preferred, and results in high hole concentrations. The use of NO or $NO_2$ gas further suppresses the formation of donor-like defects such as $V_o$ and $Zn_i$, leading to high hole mobility.

EXAMPLE

Calculations supporting the principles were carried out using density-functional theory, the generalized gradient approximation (GGA) for exchange-correlation, ultrasoft pseudopotentials, and plane waves. M. C. Payne, M. T. Teter, D. C. Allan, T. A. Arias, and J. D. Joannopoulos, Rev. Mod. Phys. 64, 1045 (1992). A suitable energy cutoff for the plane waves was determined to be 380 eV. Å 32-atom supercell was used for defect calculations, which was found to be adequate. In all the calculations, all the atoms were allowed to relax until the Hellmann-Feynman forces acting on them become less than 0.01 eV/Å.

High quality p-type ZnO films can be achieved using either NO or $NO_2$ gas as a dopant. It is known that in the equilibrium condition, the solubility of a point defect is mainly related to its formation energy, which usually depends on the atomic chemical potentials $\mu\pi$. (the energy of the relevant atoms in their respective reservoirs). The reservoir energies can vary over certain ranges but are limited by the formation of elemental solid or gas. Thus, the chemical potentials for Zn and O satisfy $$\mu_{ZnO}<\mu_{Zn}<\mu(\text{Zn metal}) \text{ and } \mu_{zno}<\mu_O<\mu(O_2 \text{ gas}) \quad (1)$$

Here, $\mu_{zno}=\mu_{zn}+\mu_o$ is the formation enthalpy of ZnO. Our calculated $\mu\pi_{zno}$ is –3.3 eV, close to the experimental value of –3.6 eV. In the equilibrium film growth conditions, the dopant sources are normally atomic elements, here N. Thus, the formation energy of a defect containing a N in ZnO films is given by $$Ef=E(n_{zn}, no, N)-n_{zn}\mu_{zn}-n_o\mu_x-\mu v_\phi \quad (2)$$

where E ($n_{zn}$, $n_o$, N) is the total energy of a system containing $n_{zn}$ Zn atoms, $n_O$ O atoms and one N atom and $\mu_N$ is the chemical potential of the N dopant. The upper bond of $\mu_N$ is determined by the chemical potential of $N_2$ molecules because some atomic N will unavoidably form $N_2$ molecules. This puts the upper limit on the chemical potential of the atomic N.

If instead of atomic N, NO or $NO_2$ gas is used as dopants, the formation energy of the same defect described by eq. (2) is then given by:

$$E_f=E(n_{zn},n_o,N)-n_{zn}m_{zn}-(n_O-1)\mu O-\mu NO \quad (3)$$

or $$E_f=E(n_{zn},n_o,N)-n_{zn}\mu_{zn}-(n_O-2)\mu_O-\mu NO2 \quad (4)$$

Here, eqs (3) and (4) are Ef for the NO gas and the $NO_2$ gas, respectively. In this case, the formation of $N_2$ requires the dissociation of NO or $NO_2$, which is kinetically limited due to the large dissociation barriers. Thus, NO or $NO_2$ molecules are not broken until they are incorporated in the film. According to eqs. (2), (3) and (4), the difference between the formation energies for the defect formed by atomic N and by NO (or by $NO_2$) molecule can be written as $\Delta E_f = \mu_{NO} - (\mu_N + \mu_O)$ (or $\mu_{NO2} - (\mu_N + 2\mu_O)$). Our calculations reveal that $\Delta E_f$ is −1.0 eV at the O-rich limit and −4.3 eV at the Zn-rich limit for using the NO gas, and 0.8 eV at the O-rich limit and −5.8 eV at the Zn-rich limit for using the $NO_2$ gas. Thus, the formation energies of N related defects are largely reduced at the Zn rich condition when NO or $NO_2$ gas is used as dopants, leading to significant enhancement of concentrations. The higher N chemical potentials (higher than ½ $\mu_{N2}$) due to the NO or $NO_2$ molecules are the reason for the defect formation energy reduction. The same principal applies to other transparent conducting oxide films.

The use of NO or $NO_2$ gas as dopants leads to an important result: an NO or an $NO_2$ molecule occupying more than one O sites in ZnO is energetically highly preferred. We call these defects multi-site substitutional molecules in order to distinguish them from the regular substitutional defects, in which a single host atom is replaced. As a result, high concentration p-type ZnO can be achieved. To demonstrate this point, we have calculated the formation energies for the various defects that could be formed by NO and $NO_2$ molecules.

FIG. 1(a) shows the structures of an NO and an $NO_2$ molecule.

FIG. 1(b) shows the single —O— site substitutional NO, denoted as (NO)O—O, which is formed by a NO molecule substituting an O atom. In effect, the N occupies a normally O site and the O of the molecule occupies an octahedral (O) interstitial site. The O of the molecule can also occupy a tetrahedral (T). This configuration is denoted as $(NO)_OT$ (not shown).

FIG. 1(c) shows the double —O— site substitutional NO: $(NO)_{OO}$. In effect, the N occupies a normally O site and the O of the NO molecule occupies a normally O site.

FIG. 1(d) shows the triple —O— site substitutional $NO_2$, $(NO_2)_{-OOO}$, wherein in effect, the N occupies a normally O site and the two O's of the $NO_2$ molecule occupy two normally O sites. The big and the small open circles represent Zn and O, respectively. The small block and gray circles represent N and O of the NO or $NO_2$ molecules, respectively.

Figure 2:
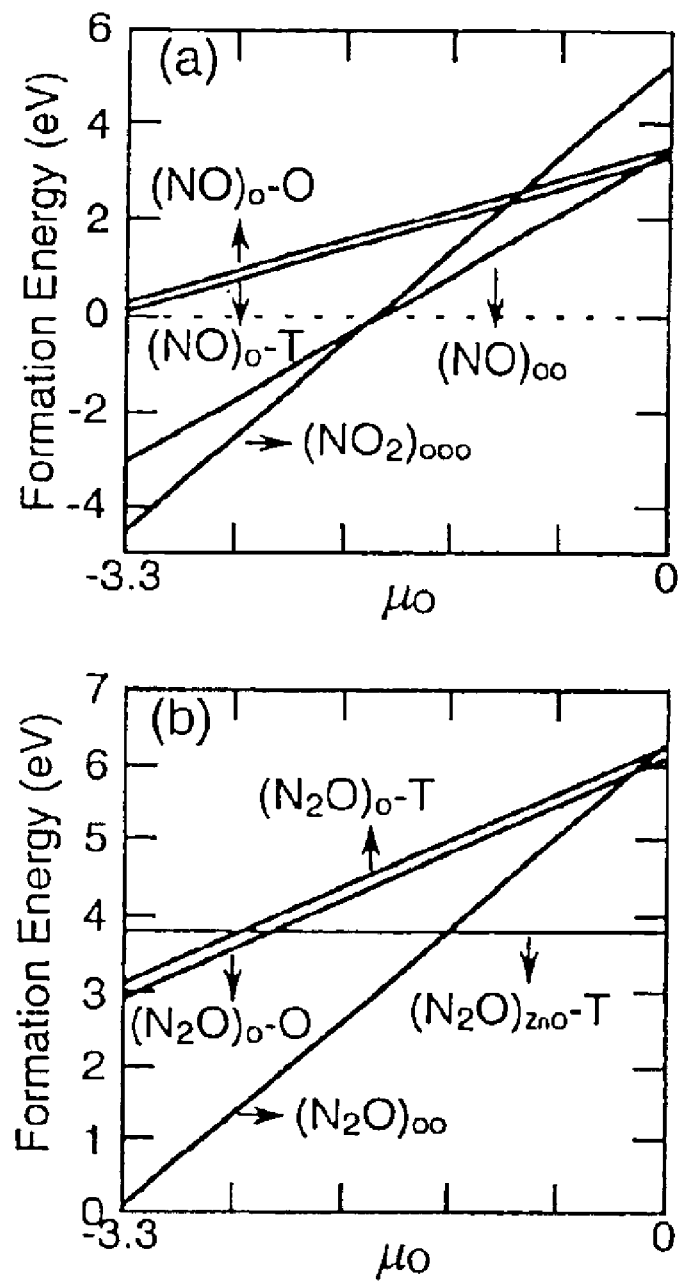
FIG. 2(a) shows the calculated formation energies as functions of the O chemical potential for the defects formed by: NO and $NO_2$ molecules.
FIG. 2(b) shows the calculated formation energies as functions of the O chemical potential for the defects formed by: $N_2O$ molecule. $\mu_o=-3.3$ is the Zn-rich limit condition where $\mu_o=0$ is the O-rich limit condition.

FIG. 2(a) shows the calculated formation energies as functions of the O chemical potential for the defects formed by: (NO and $NO_2$) molecules.

FIG. 2(b) shows the calculated formation energies as functions of the O chemical potential for the defects formed by: the $N_2O$ molecule. $\mu_o = -3.3$ is the Zn - - - rich limit condition and $\mu_o = 0$ is the O-rich limit condition. Since FIG. 2(a) shows the calculated formulation energies of these defects as functions of the O chemical potential, it is seen that the double —O— site substitutional NO and the triple —O— site substitutional $NO_2$ have negative formation energies at the ZnO-rich conditions. The negative formation energies provide strong driving force for incorporating of NO and $NO_2$ molecules into ZnO films. As it can be seen from FIGS. 1(b) and (d), the structures of $(NO)_{OO}$ and $(NO_2)OOO$ are in fact that of the conventional substitutional N, $N_O$. The $N_O$ is a shallow acceptor. Hence, high hole concentration p-type ZnO films are achieved using NO or $NO_2$ gas as dopant. In addition, (NO)OO can be viewed as a complex between an $(NO)_O$ and a $V_O$, and $(NO_2)OOO$ can be viewed as a complex between $(NO_2)_O$ and $2V_O$. This suggests that the formation of $(NO)_{OO}$ and $(NO_2)_{OOO}$ will simultaneously eliminate most of the $V_O$ the unwanted donor-like defects.

The formation of donor and donor-like defects in p-type materials are known to be detrimental to hole mobility. Thus, using NO or $NO_2$ gas as dopants results in better carrier mobility than the films doped with atomic N.

From the above calculations we see that high carrier concentration p-type ZnO films with improved carrier mobility is achieved using NO or $NO_2$ gas as a dopant. The concept of using molecules as dopants to prevent the formation of other unwanted forms of molecules in the growth chamber and the formation of multi-site substitutional defects are the keys.

While the present invention has been described and illustrated in detail, it is to be understood that the same is by way of illustration and that the spirit and scope of the invention is limited only by the appended claims.

What is claimed is:

1. A high hole concentration p-type transparent conducting oxide film characterized by improved carrier mobility and consisting essentially of: a transparent conducting oxide and a molecular doping source of a gas selected from the group consisting of NO and $NO_2$, the oxide and doping source being grown under conditions sufficient to deliver the doping source intact onto the oxide.

2. The film of claim 1 wherein the transparent conducting oxide is selected from the group consisting of ZnO, CdO, $In_2O_3$, $SnO_3$, $Ga_2O_3$, and the alloys thereof.

3. The film of claim 2 wherein said transparent conducting oxide is ZnO.

4. The film of claim 2 wherein said conditions sufficient to deliver said doping source include a temperature in the range of from about 200° to about 1000° C.

5. A method of producing high hole concentration p-type transparent conducting oxide films of improved carrier mobility comprising: growing a transparent conducting oxide and doping the oxide using a molecular doping source of a gas selected from the group consisting of NO and $NO_2$ under conditions sufficient to deliver the doping source intact on the oxide.

6. The method of claim 5 wherein the transparent conducting oxide is selected from the group consisting of ZnO, CdO, $In_2O_3$, $SnO_2$, $Ga_2O_3$, and the alloys thereof.

7. The process of claim 6 wherein said transparent conducting oxide is ZnO.

8. The process of claim 6 wherein said conditions sufficient to deliver said doping source include a temperature in the range of from about 200° to about 1000° C.

* * * * *